(12) United States Patent
Zhang et al.

(10) Patent No.: US 9,362,227 B2
(45) Date of Patent: Jun. 7, 2016

(54) TOPOLOGICAL INSULATOR IN IC WITH MULTIPLE CONDUCTOR PATHS

(71) Applicant: The Board of Trustees of the Leland Stanford Junior University, Stanford, CA (US)

(72) Inventors: Shoucheng Zhang, Stanford, CA (US); Jing Wang, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 14/447,499

(22) Filed: Jul. 30, 2014

(65) Prior Publication Data

US 2016/0035674 A1 Feb. 4, 2016

(51) Int. Cl.
*H01L 23/48* (2006.01)
*H01L 23/532* (2006.01)
*H01L 23/528* (2006.01)

(52) U.S. Cl.
CPC ........ *H01L 23/53204* (2013.01); *H01L 23/528* (2013.01); *H01L 23/5329* (2013.01)

(58) Field of Classification Search
CPC ....... H01F 1/0009; H01F 1/401; H01L 31/08; H01L 43/08
USPC ............. 257/2, 3, 9, 629, E29.005, E29.168, 257/E29.323
See application file for complete search history.

(56) References Cited

U.S. PATENT DOCUMENTS

| 2012/0138887 | A1* | 6/2012 | Zhang et al. | 257/9 |
|---|---|---|---|---|
| 2014/0160835 | A1* | 6/2014 | Soree et al. | 365/158 |
| 2014/0174343 | A1* | 6/2014 | Xue et al. | 117/97 |
| 2014/0175373 | A1* | 6/2014 | Xue et al. | 257/9 |
| 2014/0178674 | A1* | 6/2014 | Xue et al. | 428/336 |
| 2014/0179026 | A1* | 6/2014 | Xue et al. | 438/3 |
| 2014/0305484 | A1* | 10/2014 | Jung | 136/238 |
| 2015/0105262 | A1* | 4/2015 | Cheng et al. | 505/325 |
| 2015/0155464 | A1* | 6/2015 | Xu et al. | 136/200 |

* cited by examiner

*Primary Examiner* — Caleb Henry
(74) *Attorney, Agent, or Firm* — Patent Law Group LLP; Brian D. Ogonowsky

(57) ABSTRACT

A topological insulator is grown on an IC wafer in a vacuum chamber as a thin film interconnect between two circuits in the IC communicating with each other. As the TI is being grown, magnetic doping of the various TI sub-layers is varied to create different edge states in the stack of sub-layers. The sub-edges conduct in parallel with virtually zero power dissipation. Conventional metal electrodes are formed on the IC wafer that electrically contact the four corners of the TI layer (including the side edges) to electrically connect a first circuit to a second circuit via the TI interconnect. The TI interconnect thus forms two independent conducting paths between the two circuits, with each path being formed of a plurality of sub-edges. This allows bi-direction communications without collisions. Since each electrode contacts many sub-edges in parallel, the overall contact resistance is extremely low.

7 Claims, 2 Drawing Sheets

TOPOLOGICAL INSULATOR IN IC WITH MULTIPLE CONDUCTOR PATHS

GOVERNMENT LICENSE RIGHTS

This invention was made with Government support under contract N66001-11-1-4105 awarded by the Defense Advanced Research Projects Agency. The Government has certain rights in the invention.

FIELD OF THE INVENTION

The invention relates to interconnects in integrated circuits and, in particular, to an interconnect in an integrated circuit formed using a magnetically doped topological insulator having two opposite conducting edges, where each edge comprises a plurality of conducting edges connected in parallel by an electrode.

DESCRIPTION OF THE RELATED ART

Quantum anomalous Hall (QAH) states are a new state of quantum matter with an insulating bulk gap and gapless chiral edge states interesting for condensed matter physics, material science and electrical engineering. The QAH effect is considered as a quantized version of anomalous Hall effect. It been theoretically predicted [Phys. Rev. Lett. 101, 146802 (2008); Science 329, 5987 (2010)] and experimentally observed in magnetic topological insulators (TIs) of Cr-doped $(Bi,Sb)_2Te_3$ [Science 340, 167 (2013)]. TIs $Bi_2Se_3$, $Bi_2Te_3$ and $Sb_2Te_3$ are stoichiometric rhombohedral crystals with layered structure consisting of stacked quintuple layers (QLs), with relatively weak Van der waals coupling between QLs (each QL is about 1 nm thick). Therefore high quality thin films have been successfully grown on silicon and silicon carbide substrates via molecular beam epitaxy, layer by layer, which enables further scientific study and applications integratable with today's electronics. These materials have also been grown by Au-catalyzed vapor-liquid-solid and catalyst-free vapor-solid chemical vapor deposition methods on silicon, silicon dioxide and silicon nitride substrates. With proper doping of transition metal elements (Cr or Fe), the thin film topological insulators form magnetically ordered insulators, and the magnetic order gives rise to a QAH insulator with chiral edge states. By varying the magnetic doping density in the various stacked TI layers (while being grown) and the thickness of the thin film topological insulator, multiple chiral edge states will be formed.

SUMMARY OF THE INVENTION

An autobahn interconnect has been previously disclosed by the inventors (US Publication 2012/0138887) in which the electrons move along the edge of the device uni-directionally, like automobiles on a highway (Autobahn). Such interconnect dramatically lowers dissipation along the channel by avoiding random scattering. However, contact resistance at the electrode still limits the performance of the device. Whereas previous inventions enable electrons to move along a single lane in one direction, the new invention enables them move along a plurality of different lanes in one direction (in parallel), and these parallel conducting edges are electrically connected together by an electrode, thus dramatically lowering the overall contact resistance between the metal electrode and the topological insulator material and improving the device performance. The lowering of the contact resistance is analogous to connecting a plurality of resistors in parallel.

The present invention is better understood upon consideration of the detailed description below and the accompanying drawings.

DETAILED DESCRIPTION OF THE PREFERRED EMBODIMENTS

Figure 1:
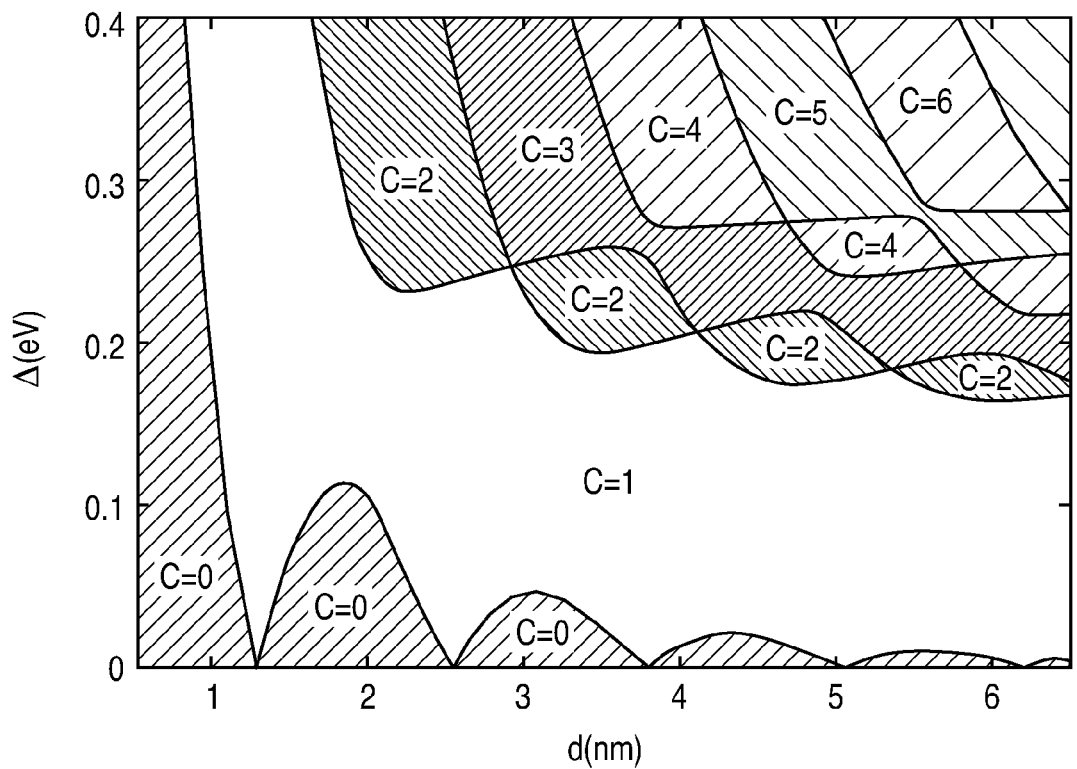
FIG. 1 illustrates how the number of chiral edge channels can be tuned by exchange coupling and thickness of topological insulators. Here we use a typical magnetic topological insulators $Bi_{2-y}Cr_y(Se_xTe_{1-x})_3$.

In accordance with the principles of the present invention, an electrical device incorporates a magnetic TI layer as an interconnect layer in an integrated circuit and includes at least one electrode in electrical contact with the edge of the magnetic TI layer.

In the present description, a topological insulator, in two or three dimensions, is a material having insulating energy gaps in the bulk and gapless edge or surface states on the sample boundary that are protected by time-reversal symmetry. That is, a topological insulator is a material with a bulk insulating gap and a conducting surface state protected from any time reversal invariant perturbation. In the present description, gapless edge or surface states refer to an edge or surface states having a zero bandgap. In other words, a topological insulator is a material that behaves as an insulator in its interior while permitting the movement of charges on its boundary. Furthermore, the surface states of a topological insulator have a widely tunable bandgap depending on the thickness of the topological insulator layer.

In particular, when the thickness of the topological insulator is large enough, the surface states are gapless or have negligible band gap, that is the bandgap is zero. When the thickness of the topological insulator is small enough, the surface states become gapped or have appreciable energy band gap due to the finite size effect of the thin film. That is, the thin film topological insulator behaves as a semiconductor material with a continuous tunable bandgap.

The thin films of topological insulators, when doped with transition metal elements, will form magnetically ordered insulators. The magnetic elements will introduce exchange coupling in the topological insulator. That is to make the topological insulators spin polarized. The exchange coupling induced by magnetic order competes with the semiconductor bandgap induced by the finite size effect. When the exchange coupling is larger than the semiconductor bandgap, it could give rise to a topologically nontrivial electronic structure characterized by a finite Chern number and gapless chiral edge states, with quantized Hall conductance $e^2/h$. That is, the thin film topological insulator behaves as a semiconductor material while permitting the movement of charges on its edges. A Chiral edge state refers to an edge state that carries current uni-directionally.

The chiral edge state of the QAH effect in magnetic TI is dissipationless. In the sense that, it carries current uni-directionally at the sample edges and it will not be backscattered even in the presence of impurities.

Known materials for forming a topological insulator layer include: HgTe, $Bi_xSb_{1-x}$, $Sb_2Te_3$, $Bi_2Te_3$, $Bi_2Se_3$, $TlBiTe_2$ and $TlBiSe_2$. A topological insulator can also be formed using selected tenary Heusler compounds or selected chalcogenides, such as $Ge_1Bi_4Te_7$, $Ge_2Bi_2Te_5$, and $Ge_1Bi_2Te_4$. Other materials or compounds for forming a topological insulator are possible. The electrical device of the present invention can be constructed using any topological insulator materials, currently known or to be developed. Method for forming such TI materials is well known.

Various transition metal elements can be doped into topological insulators described above, and form magnetically ordered insulators. The transition metal elements include: Titanium (Ti), Vanadium (V), Chromium (Cr), Manganese (Mn), Iron (Fe), Cobalt (Co), Nickel (Ni), Iridium (Ir), Europium (Eu), Gadolinium (Gd). The doping concentration can be as large as 30%, relative to the bulk TI material. For example, $Sb_{2-x}Cr_xTe_3$, x doping can tuned to be 0.6. Other transition metal elements doped in topological insulators for forming magnetically ordered insulators are possible, currently known or to be found. Such methods for doping are well known.

By tuning the doping concentration of transition metal elements in topological insulators, the exchange coupling between the local moments of the transition metal elements and topological insulators can be controlled. More doping density of transition metal elements in topological insulators will induce larger exchange coupling.

By varying the exchange coupling in the sub-layers of the topological insulator as the insulator is grown (in a vacuum chamber), by varying the magnetic doping during growth, the number of chiral edge states can be well tuned. The thickness of the magnetic topological insulator (a thin film) also determines the number of conducting edge layers. Each conducing edge is a separate conducting channel that may conduct a signal in parallel. Accordingly, the QAH effect with higher Chern number will be realized by the selective magnetic doping. That is, the QAH effect with higher Chern number has large number of chiral edge states (more than 1), and the number of edge states is the Chern number. These chiral edge states carry current uni-directionally at edges of the thin film.

Referring to FIG. 1, for a typical magnetic topological insulator $Bi_{2-y}Cr_y(Se_xTe_{1-x})_3$, the Cr content (magnetic doping density) can be varied, as well as the Se/Te ratio. In this system, tunable magnetic ordering and topological properties are well suited for realization of higher Chern number QAH effect. As shown in FIG. 1, a large exchange field and large thickness of topological insulator will give rise to higher Chern number QAH effect, thus large number of chiral edge states.

Applications

The electrical device having chiral interconnects formed by a magnetic topological insulator and its performance characteristics will now be described. The following description is illustrative only of the applications in which a magnetic topological insulator can be used.

Quantized Anomalous Hall (QAH) Effect Interconnect with Multiple Lanes

According to Moore's law, the number of transistors in integrated circuits doubles approximately every two years. If the trend continues, atomic length scales will be reached around 2015. Besides transistors, one also needs to scale the copper interconnect—another major component in integrated circuits. Scaled wires have higher resistance and capacitance, and therefore reduced bandwidth, higher delays and higher power dissipation. Such problems offset the performance benefits of transistor scaling. The hope of significant technological improvements involves addressing quantum effects directly. Current scientific development is to use the optical interconnect, and it is a way of communication by optical cables. However, transforming optical signal to electric signal adds complexity and expense. Harnessing the quantum nature of matter—such as the quantum phase and spin of the electron—rather than trying to combat it offers the prospect of unprecedented device performance, well beyond that allowed by classical principles.

According to embodiments of the present invention, an inside-multiple-channel-dissipationless chiral edge state interconnect device is formed using a magnetic topological insulator layer. The magnetic topological insulator layer is grown on the integrated circuit wafer in a vacuum chamber, using photolithographic techniques to define the shapes and locations of the magnetic topological insulator layer in the integrated circuit. Growing topological insulators for scientific analysis is known, and it would be well within the skills of those in the field of growing topological insulator layers to grow the present inventive layers in selected locations on an integrated circuit wafer. Hundreds of papers have been written detailing methods to form TIs (even if only referring to the material chemical composition) and experiments performed on the TIs. One needing a TI material without having a fabrication facility can easily request a suitable facility, such as a university identified in the various papers, to grow the TI material. As one example out of many, the paper entitled, Quasi-particle Scattering and Protected Nature of Topological States In a Parent Topological Insulator $Bi_2Se_3$, by S. R. Park et al, published Dec. 19, 2009, states: "Single crystals were grown by a self flux technique, following the previously reported recipe." The "recipe" is from the paper entitled "p-type $Bi_2Se_3$ For Topological Insulator and Low Temperature Thermoelectric Applications," by Y. S. Hor, Phys. Rev. B 79, 195208 (2009). The term "recipe" denotes a formula that leads the reader through the steps to form the TI material. The Y. S. Hor paper provides a detailed description of a method to form the $Bi_2Se_3$ TI material, and the fact that the S. R. Park team was able to fabricate the TI material using the "recipe" in the Y. S. Hor paper illustrates that anyone wanting to make a TI material need only follow the directions provided in published papers. Similarly, the paper entitled, Topological Insulator $Bi_2Se_3$ Thin Films Grown On Double-Layer Graphene By Molecular Beam Epitaxy, by Can-Li Song et al., Applied Physics Letters, Vol. 97, Issue 14, October 2010, describes forming $Bi_2Se_3$. The paper entitled, Intrinsic Topological Insulator Bi2Te3 Thin Films on Si and Their Thickness Limit, by Yao-Yi Li, Shou-Cheng Zhang (a present co-inventor from Stanford University), et al., Adv. Mater. 2010, 22, 4002-4007, also describes steps for forming the TI material on a silicon substrate using molecular beam epitaxy. Similarly, the paper entitled, Growth Dynamics and Thickness-Dependent Electronic Structure of Topological Insulator Bi2Te3 Thin Films on Si, by Yao-Yi Li, Shou-Cheng Zhang (a present co-inventor from Stanford University), et al., arXiv:0912.5054 [cond-mat.mes-hall], Dec. 27, 2009, also describes steps for forming the TI material on a silicon substrate using molecular beam epitaxy. The paper entitled, "Anomalous Transport In an n-Type Topological Insulator Ultrathin $Bi_2Se_3$ Film, by T. Hirahara, Phy. Rev. B 82, 155309 (2010), also provides a very detailed recipe for forming the thin $Bi_2Se_3$ film suitable for our invention. The paper entitled, "Quintuple-layer Epitaxy of High-Quality $Bi_2Se_3$ Thin Films for Topological Insulator," by Guanhua Zhang et al, describes another recipe for fabricating thin films of the $Bi_2Se_3$ suitable for our invention. All these papers are incorporated by reference to identify the state of the art in fabricating TI materials. These papers also reference other papers for additionally describing methods of forming and doping TI materials. The pertinent person skilled in the present field of forming TI materials has a PhD in physics or material science and is thoroughly familiar with techniques for epitaxially growing thin films. Such a person will be able to form the materials and structures of the present invention without undue experimentation. Basically, the TI material $Bi_2Se_3$ or $Bi_2Te3$ is grown, layer by layer, on an Si substrate in a vacuum chamber by molecular beam epitaxy using evaporated Bi and Se or Te. Preferably, the TI layers are grown over an Si substrate to allow other circuit elements to be formed in the same substrate. Forming the 2-D or 3-D layers of the TI material on an IC for conducting 2-way current between two circuits would only entail the magnetic doping steps described herein and the process steps of masking and etching that are generally used to pattern conductors in an IC. The IC circuits may be any type of circuit, such as a high speed memory circuit or a communications circuit. Magnetic doping of the TI material during formation is also well-known and described in some of the above papers.

The high Chern number QAH effect can be realized in such a magnetic topological insulator. Such an interconnect dramatically lowers dissipation along the channel by avoiding random scattering. However, the contact resistance between the metal electrode (connecting the TI edge to a conventional circuit in the IC) and the TI material still limits the performance of the device. By using the present invention, the multiple chiral edge channels lower the contact resistance, significantly improving the device performance.

Figure 2:
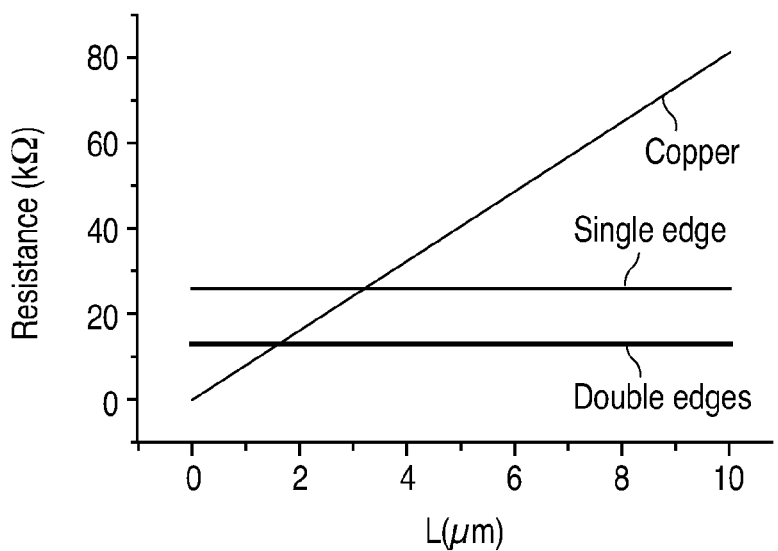
FIG. 2 is a graph comparing the resistance of the copper, single channel and two channels quantized anomalous Hall Effect interconnects.

FIG. 2 is a graph comparing the resistance of the copper, single channel and two channels quantized anomalous Hall Effect interconnects. As seen, the resistance of a copper wire increases linearly with length, while the single edge and double edge resistances do not substantially increase with length. As more edges are connected in parallel, the resistance reduces. FIG. 2 does not address contact resistance between an electrode and the conductors, and the present invention is directed to reducing such contact resistance.

As mentioned above, the 2-D topological insulator (TI) described above, containing the magnetic dopants, exhibits insignificant resistance along its edges. The TI is grown in layers called quintuple layers, as discussed above. Each quintuple layer is only about only one nanometer thick. Each edge of the TI has many separate conduction paths (substantially electrically insulated from one another) by varying the magnetic dopant density (e.g., between 0-30%) in the layers while the TI is grown. The number of layers depends on the thickness of TI. The variation of the magnetic doping as the TI layers are grown determines the number of conducting edge channels that will be connected in parallel by the metal electrode.

By forming the TI as a thin (less than 1 micron) and narrow (less than 1 micron) conductor between two circuits, with metal electrodes contacting each edge of the TI layers, an extremely low loss interconnect is formed. Each edge may conduct a separate current signal, since the major surfaces of the TI interconnect have the properties of an insulator. The metal electrodes may be standard metal electrodes used in integrated circuits (ICs), such as copper, gold, platinum, silver, aluminum, etc. The metal may be sputtered on and patterned using conventional photolithographic techniques.

Since one edge of the TI interconnect has several chiral edge states, namely several separate conductors in parallel, the overall contact resistance between the metal electrode and the edge is very low, since the contact resistances to the many sub-edges, making up a single edge of the TI, are electrically connected in parallel by the electrode.

Figure 3:
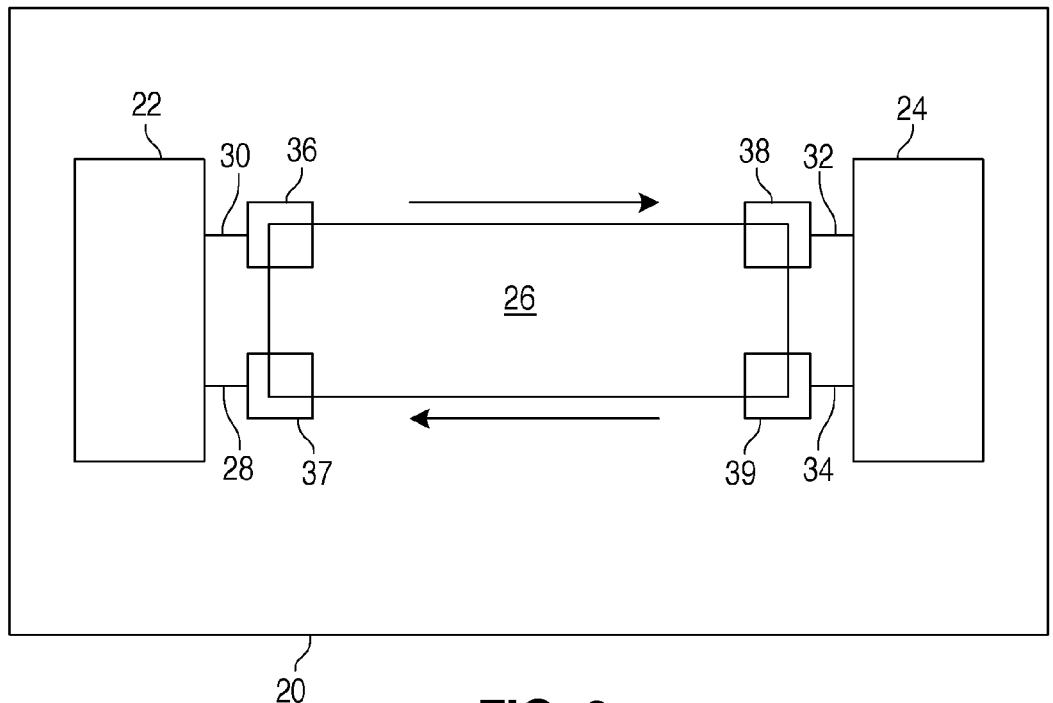
FIG. 3 illustrates the TI interconnect formed in an IC interconnecting two circuits, in accordance with one embodiment of the invention.
Figure 4:
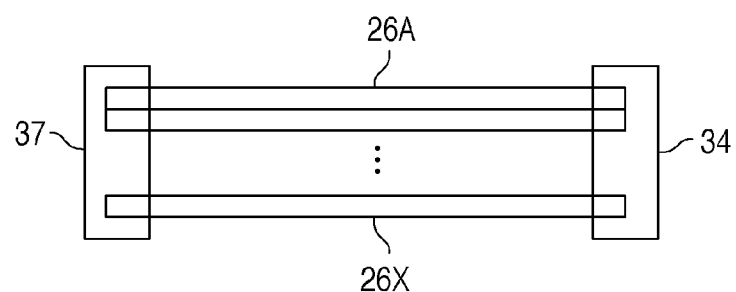
FIG. 4 illustrates various sub-edges of the TI interconnect that conduct in parallel and are electrically connected together by a metal electrode.

FIG. 3 is a schematic view of a small portion of an IC 20. A first circuit 22 and second circuit 24 are shown connected to a very thin (less than 1 micron) and narrow (less than 1 micron) 2-D TI 26. In one embodiment, the TI 26 is formed of a plurality of layers and is magnetically doped, as described above. FIG. 4 is a side view of the TI 26 showing the various layers 26A-26X, acting as stacked conductors in parallel. The TI 26 may be formed to a width of a fraction of a micron, or the narrowest width possible using state of the art processes, without any adverse effect on conductivity, since the conductance is only along the edges within a few nanometers of the surface.

The circuit 22 is shown having an input terminal 28 and an output terminal 30, where the output terminal 30 generates a positive current flowing toward the right. Similarly, the circuit 24 is shown having an input terminal 32 and an output terminal 34, where the output terminal 34 generates a positive current flowing toward the left. The electrically isolated currents may flow in any direction, but importantly there is no interference between the two current paths. Since the TI 26 does not need a physical gap between the two edges, the TI 26 can be made much narrower than two metal wires separated by a gap. Further, the resistance of the edge conduction is less than that of a wire.

Conventional metal electrodes 36-39 are shown formed at and around the corners of the TI 26 to contact the edges of the TI 26 layers and connect them in parallel.

The length of the TI 26 is any length necessary to connect the two circuits 22 and 24. Any length of metal wire (trace) can connect the TI electrodes 36-39 to the circuit 22/24 terminals. Using the TI 26 is particularly beneficial for relatively long runs in an IC where very low resistance is desirable. Due to its very low resistance, very low power signals may be conducted without significant dissipation, allowing for faster speeds than had conventional metal wires been used.

The TI 26 may be further connected to other circuits.

The TI 26, in its configuration of FIG. 3, is referred to as an autobahn interconnect since traffic (current) simultaneously flows in two opposite directions separated by a divider (the center insulation portion of the TI 26).

Further information about topological insulators used as interconnects in an IC may be found in the U.S. application Ser. No. 13/312,942, now US publication 2012/0138887 by one of the present co-inventors, Shoucheng Zhang, incorporated herein by reference.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An electrical circuit comprising:
a first circuit (22) generating a first current signal;
a second circuit (24) generating a second current signal;
a magnetically doped, topological insulator (26) formed of a plurality of layers (26A-26X), each layer of the topological insulator having conductive edges with insulating properties between the edges, a first edge of the topological insulator forming a first set of edges of the layers, and a second edge of the topological insulator forming a second set of edges of the layers;

a first electrode contacting the first set of edges;

a second electrode contacting the second set of edges;

the first current signal being coupled to the first electrode; and the second current signal being coupled to the second electrode, wherein the first set of edges of the topological insulator comprises a first plurality of separate conduction paths, wherein the first plurality of separate conduction paths are electrically connected in parallel by the first electrode, and wherein the second set of edges of the topological insulator comprises a second plurality of separate conduction paths, wherein the second plurality of separate conduction paths are electrically connected in parallel by the second electrode.

2. The circuit of claim 1 wherein the topological insulator is doped with one or more of the following metals to form a magnetically ordered insulator: Titanium (Ti), Vanadium (V), Chromium (Cr), Manganese (Mn), Iron (Fe), Cobalt (Co), Nickel (Ni), Iridium (Ir), Europium (Eu), and Gadolinium (Gd).

3. The circuit of claim 1 wherein the plurality of layers comprise quintuple layers, each quintuple layer being only about one nanometers thick.

4. The circuit of claim 1 wherein the topological insulator is a quantum anomalous Hall insulator material.

5. The circuit of claim 1 wherein the topological insulator has a width less than 1 micron and a thickness less than 1 micron.

6. The circuit of claim 1 wherein the first set of edges of the topological insulator comprises the first plurality of separate conduction paths by having a varying magnetic dopant density in the plurality of layers, wherein the first plurality of separate conduction paths are electrically connected in parallel by the first electrode, and wherein the second set of edges of the topological insulator comprises a second plurality of separate conduction paths by having a varying magnetic dopant density in the plurality of layers, wherein the second plurality of separate conduction paths are electrically connected in parallel by the second electrode.

7. The circuit of claim 1 wherein the first electrode and the second electrode are metals, where the metals are different from the topological insulator material.

* * * * *